United States Patent
Yukumatsu et al.

(10) Patent No.: US 7,642,902 B2
(45) Date of Patent: Jan. 5, 2010

(54) VEHICLE ABNORMALITY DETECTING DEVICE

(75) Inventors: Norimitsu Yukumatsu, Kobe (JP); Akio Okahara, Kobe (JP); Tomohiko Tamaki, Kobe (JP); Takayuki Seto, Aki-gun (JP)

(73) Assignee: Fujitsu Ten Limited, Kobe (JP)

( * ) Notice: Subject to any disclaimer, the term of this patent is extended or adjusted under 35 U.S.C. 154(b) by 373 days.

(21) Appl. No.: 11/656,984

(22) Filed: Jan. 24, 2007

(65) Prior Publication Data
US 2007/0185677 A1 Aug. 9, 2007

(30) Foreign Application Priority Data
Jan. 31, 2006 (JP) .............................. 2006-022218

(51) Int. Cl.
*B60Q 1/00* (2006.01)
(52) U.S. Cl. ................. 340/438; 340/425.5; 340/426.1; 340/428
(58) Field of Classification Search ............... 340/425.5, 340/426.1, 428
See application file for complete search history.

(56) References Cited

U.S. PATENT DOCUMENTS 5,293,150 A * 3/1994 Neuffer et al. ......... 340/426.23

FOREIGN PATENT DOCUMENTS

| JP | A 5-30440 | 2/1993 |
|----|-----------|--------|
| JP | A 6-46502 | 2/1994 |
| JP | A 6-138232 | 5/1994 |
| JP | A 10-151994 | 6/1998 |
| JP | A 11-268599 | 10/1999 |
| JP | A 2000-338241 | 12/2000 |
| JP | A 2001-257573 | 9/2001 |

* cited by examiner

*Primary Examiner*—Daryl Pope
(74) *Attorney, Agent, or Firm*—Oliff & Berridge, PLC

(57) ABSTRACT

Provided is a vehicle abnormality detecting device including an abnormality detecting unit 70A for detecting abnormality on the basis of a state of current supply to a state detecting unit 30, and a power supply control unit 11 for switching a state of power supply to the state detecting unit 30 when the abnormality was detected by the abnormality detecting unit 70A, so that power consumption at the time of detecting the abnormality is suppressed to avoid the battery consumption.

15 Claims, 10 Drawing Sheets

VEHICLE ABNORMALITY DETECTING DEVICE

BACKGROUND OF THE INVENTION

1. Field of the Invention

The present invention relates to a vehicle abnormality detecting device for detecting whether or not an installation position and an operational state or the like are appropriate with respect to functional parts such as various kinds of sensors installed in a vehicle.

2. Description of the Related Art

In recent years, many functional parts such as various kinds of sensors to exhibit a predetermined effect are mounted onto a vehicle in order to facilitate higher functionality and higher safety. For example, Japanese Unexamined Patent Publication No. H06-138232 indicates that a radar head unit of a radar device is arranged in an engine room adjacent to a front grill of the engine room in order to prevent collisions by detecting obstacles such as a preceding vehicle.

The above radar head unit is arranged in the engine room so as to prevent damages easily made by a contact with other vehicles and obstacles.

However, in the case of arranging functional parts such as the above radar device in a portion such as a bumper which is easily influenced by a contact with other vehicles and obstacles, there was a danger of resulting in inability to exhibit functions thereof appropriately due to deformation of an installation portion caused by the shock.

It is therefore considered to arrange a state detecting unit composed of a sensor and a switch or the like for detecting an installation position and an operational state of functional parts such as the radar device, including an abnormality detecting unit for detecting the abnormality on the basis of a state of current supply to the state detecting unit, in order to detect whether or not the functional parts is in a state of being capable of exhibiting its functions appropriately.

For example, if deformation of an installation portion caused by a shock due to a contact with other vehicles and obstacles is detected by the abnormality detecting unit, a warning display or the like is exhibited for a driver so that maintenance can be facilitated.

If a switch mechanism of a mechanical contact system such as, for example, a momentary switch is employed as the state detecting unit for detecting an installation position or the like of the functional parts as described above, it is necessary to supply a relatively large detection current to the switch in order to avoid a conduction failure generated by having an oxide film on a contact surface thereof due to a secular change. Meanwhile, even if other switches and sensors are employed as the state detecting unit, it is necessary to supply electrical power for detecting a state.

However, if a conduction state of the switches and an active state of the sensors are continued from one cause or another, or if an On state of the switches is maintained and a short-circuit failure is generated due to mechanical deformation of the installation portion for example, power is constantly consumed, having a problem such as inability to operate an engine due to battery consumption especially when such a state is maintained for a long period of time during a state that an ignition key is turned off.

SUMMARY OF THE INVENTION

An object of the present invention is to provide a vehicle abnormality detecting device capable of avoiding the battery consumption by suppressing power consumption in a state detecting unit while detecting abnormality of the functional parts appropriately.

In order to achieve the above object, the vehicle abnormality detecting device according to the present invention is provided with an abnormality detecting unit for detecting the abnormality on the basis of a state of current supply to a state detecting unit, and a power supply control unit for switching a state of power supply to the state detecting unit when the abnormality was detected by the abnormality detecting unit.

Furthermore, another object of the present invention will be specifically indicated by referring to embodiments below.

DESCRIPTION OF THE PREFERRED EMBODIMENTS

Explained below is an embodiment to apply a vehicle abnormality detecting device according to the present invention to a vehicle as a control system realized in cooperation with a plurality of ECUs (electronic control units) in order to detect the abnormality in an installation position of a radar device which was installed in the vehicle.

Figure 2:
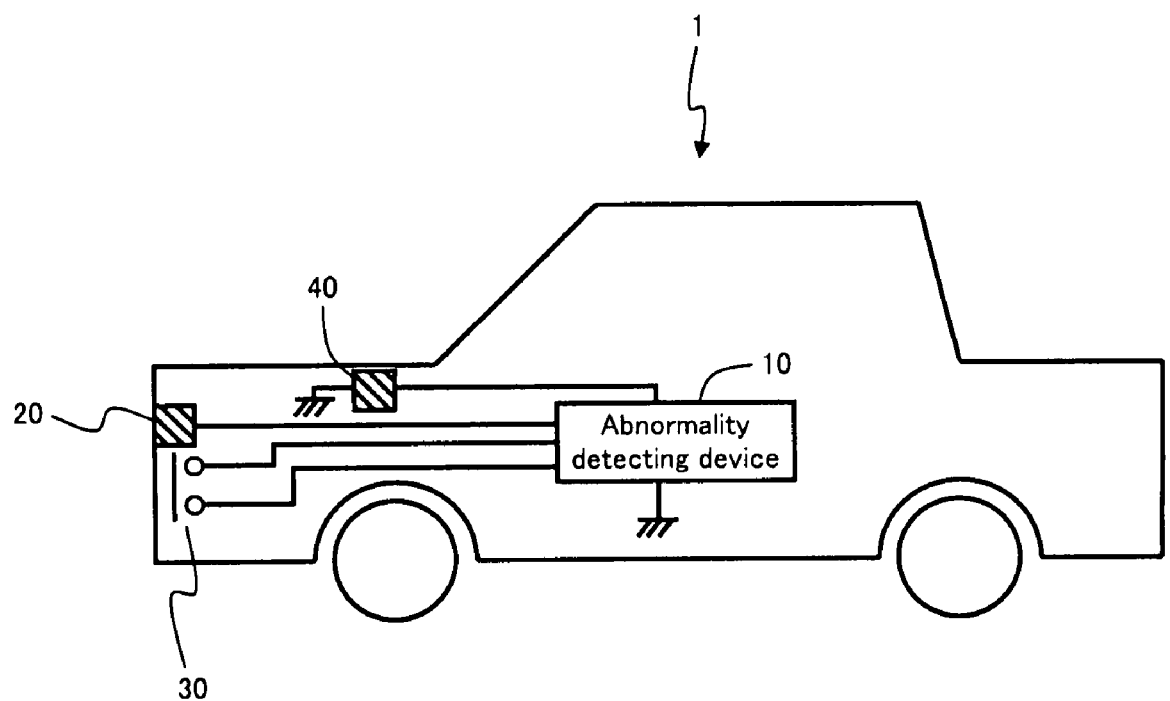
FIG. 2 is an explanatory diagram showing an arrangement of the abnormality detecting device incorporated in a vehicle.

In a vehicle 1, an abnormality detecting device 10 is connected to a radar device 20 for detecting external circumstances of the vehicle, a state detecting unit 30 as a collision detecting switch arranged in the vicinity of the radar device 20 for detecting the abnormality in an installation state of the radar device 20, and a battery 40 arranged in an engine room of the vehicle 1, as shown in FIG. 2.

The radar device 20 is a device to detect obstacles or the like by sending radar waves for forward monitoring of the vehicle, and arranged adjacent to a front grill of the engine room in the vehicle 1 in the present embodiment. Examples of the radar device 20 include a millimeter-wave radar for use in following travel of the vehicle.

The state detecting unit 30 is composed of a momentary switch mechanism of a mechanical contact type for detecting the abnormality in an installation state of the radar device 20, being arranged in the vicinity of the radar device 20.

To be more specific, if an installation state of the radar device 20 is a normal state, the state detecting unit 30 exhibits an Off state, while the state detecting unit 30 is turned to be the On state if an installation state of the radar device 20 is changed due to a reason such as a collision of the vehicle with the obstacle. When the state detecting unit 30 is turned to be the On state, it is necessary to supply a relatively large detection current to the switch in order to avoid a conduction failure caused by an oxide film generated on a contact surface of the switch due to the secular change.

If the abnormality is generated in an installation state of the radar device 20 due to collisions and contact accidents or the like, the state detecting unit 30 is turned to be the On state so that the abnormality is detected by the abnormality detecting device 10. Thereafter, the abnormality detecting device 10 detects the On state of the state detecting unit 30, followed by suppressing an electric power supplied to the state detecting unit 30. As a result, consumption of the battery 40 can be avoided.

Figure 3:
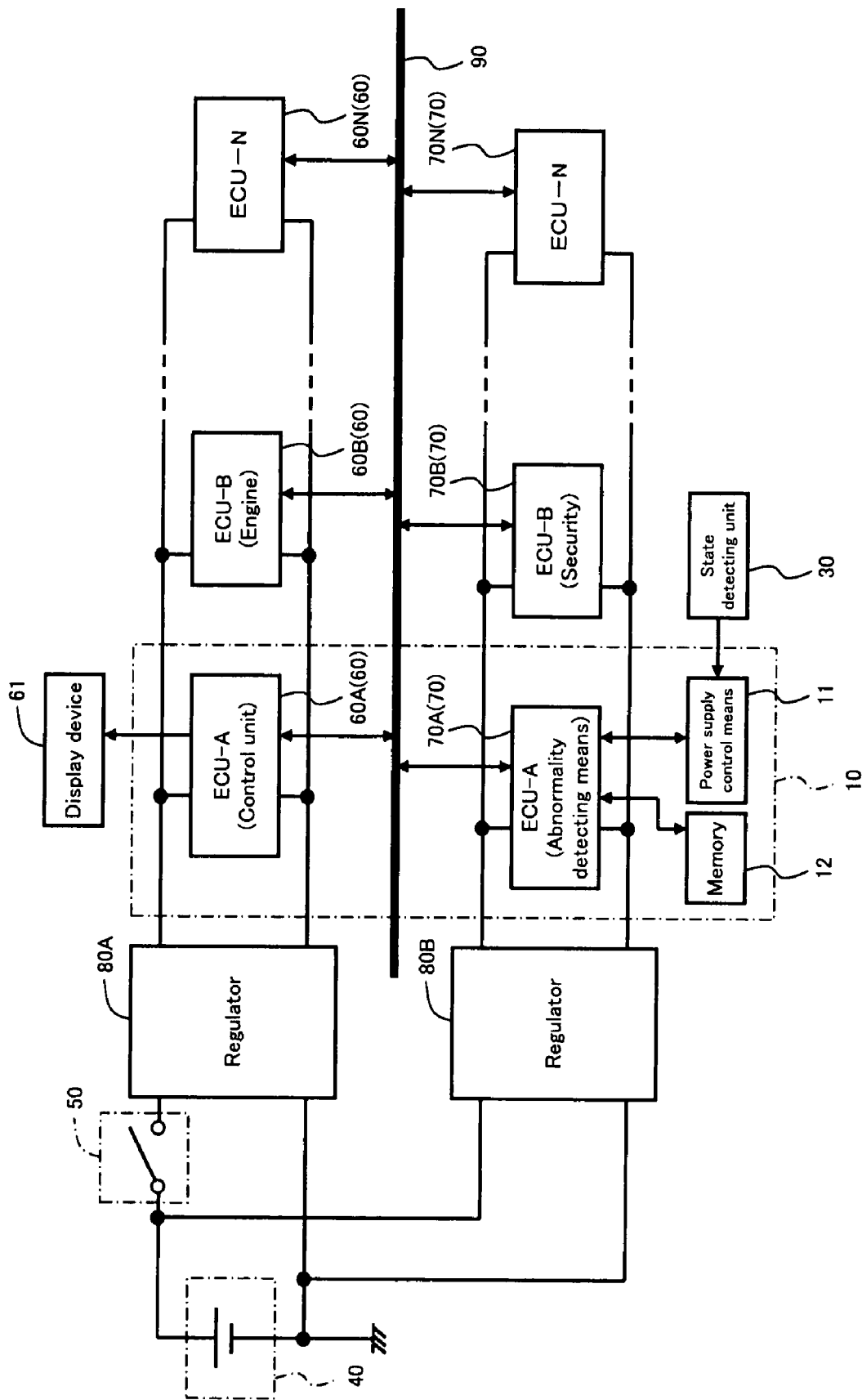
FIG. 3 is a function block configuration diagram showing the abnormality detecting device which was incorporated in a vehicle control system realized in cooperation with a plurality of electronic control units.

Shown in FIG. 3 is a function block configuration in which the abnormality detecting device 10 is incorporated in the vehicle 1 as a control system realized in cooperation with the plurality of the ECUs provided with microcomputers. This system includes an ignition switch 50, an IG-on ECU 60 being the plurality of the ECUs to operate exclusively when the ignition switch 50 is turned on, a constant-on ECU 70 being the plurality of the ECUs to operate irrespective of a state of the ignition switch 50, a regulator 80A for supplying an appropriate DC constant voltage to the IG-on ECU 60, and a regulator 80B for supplying an appropriate DC constant voltage to the constant on ECU 70, in which the IG-on ECU 60 and the constant-on ECU 70 are connected to a network via a bus 90 such as a CAN (controller area network) respectively.

The plurality of the ECUs is composed of a control unit 60A in the abnormality detecting device 10 and an engine control ECU 60B or the like as the IG-on ECU 60, and composed of an abnormality detecting unit 70A in the abnormality detecting device 10 and a security ECU 70B or the like as the constant-on ECU 70.

The abnormality detecting device 10 will be explained below.

Figure 1:
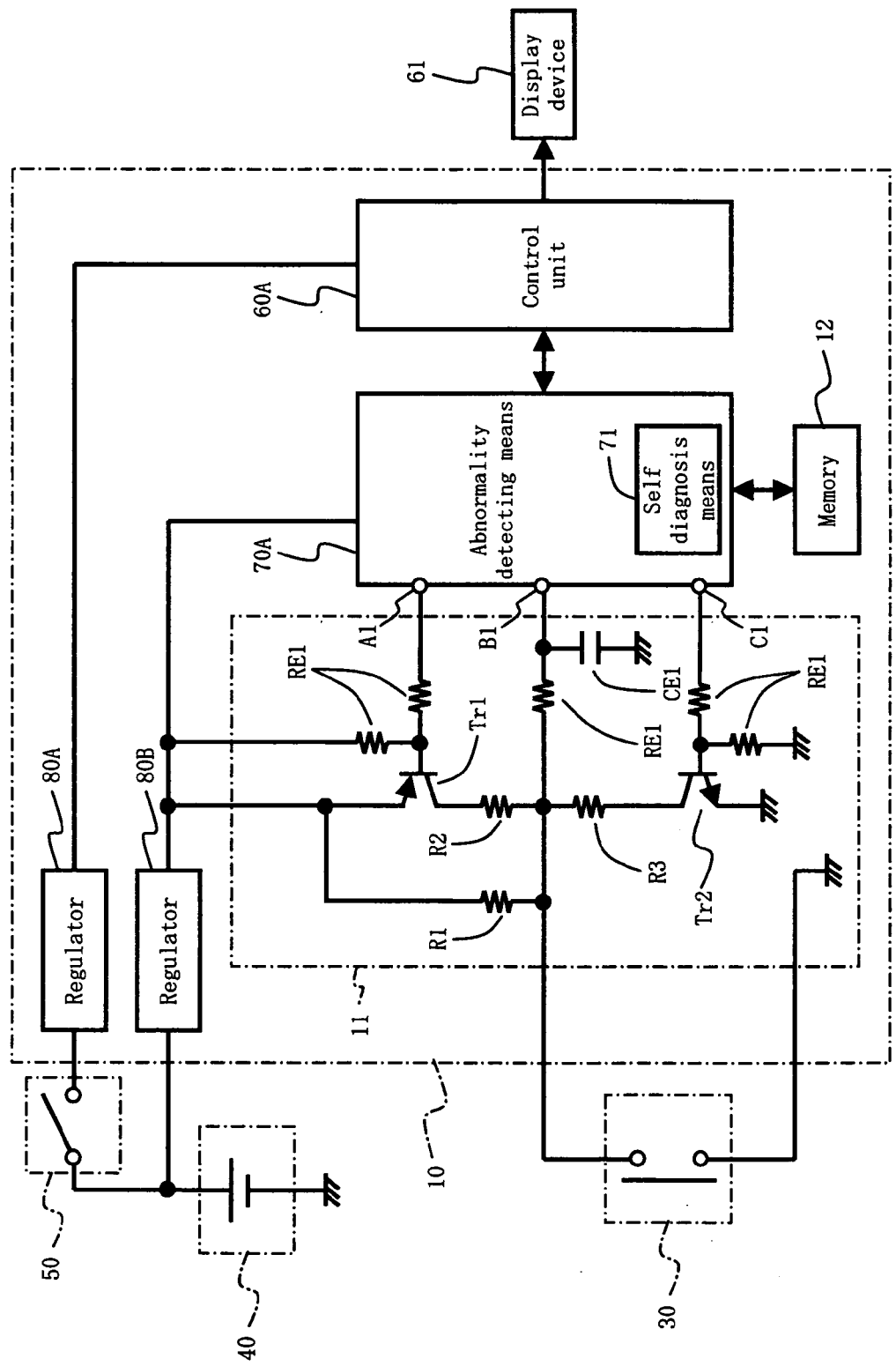
FIG. 1 is a function block configuration diagram of an abnormality detecting device according to the present invention.

As shown in FIGS. 1 and 3, the abnormality detecting device 10 has a configuration including the control unit 60A for controlling an operation in each of the units in the abnormality detecting device 10, the abnormality detecting unit 70A for detecting the abnormality on the basis of a state of current supply to the state detecting unit 30, the regulator 80A for supplying an appropriate constant voltage to the control unit 60A, the regulator 80B for supplying an appropriate constant current to the abnormality detecting unit 70A, a power supply control unit 11 for switching a state of power supply to the state detecting unit 30 when the abnormality was detected by the abnormality detecting unit 70A, and a memory 12 for storing information such as state history and diagnostic results. The control unit 60A is also connected to a display device 61 for displaying information sent from the control unit 60A in the configuration.

The control unit 60A is configured to control an operation in each of the units in the abnormality detecting device 10. To be more specific, the control unit 60A demands abnormality history such as collision history detected by the state detecting unit 30, demands to execute self diagnosis to be described below, and demands a result of the self diagnosis with respect to the abnormality detecting unit 70A, while causing the display device 61 to display a result of the self diagnosis received from the abnormality detecting unit 70A.

Moreover, the control unit 60A is connected to the battery 40 via the ignition switch 50. That is, the control unit 60A does not operate unless the ignition switch 50 is turned to be the On state.

The abnormality detecting unit 70A is configured to detect the abnormality on the basis of a state of current supply to the state detecting unit 30. To be more specific, the abnormality detecting unit 70A is connected to the power supply control unit 11 by three points including a terminal A1, a terminal B1, and a terminal C1 in the configuration, in which a state of current supply to the state detecting unit 30 is determined by detecting a voltage of the terminal B1, and if the abnormality is detected, a current supplied to the state detecting unit 30 is suppressed by adjusting voltages of the terminal A1 and the terminal C1.

Moreover, the abnormality detecting unit 70A is configured to include a self diagnosis unit 71 which executes self diagnosis for detecting whether or not the state detecting unit 30 and the power supply control unit 11 normally operate.

More specifically, the self diagnosis unit 71 is configured to execute self diagnosis to detect existence of circuit failures and abnormality detection or the like by referring to a voltage state of the terminal B1 when voltage states of the terminal A1 and the terminal C1 are changed, and also made to execute the self diagnosis at least at the time of starting power supply in the configuration. The time of starting power supply is meant to be, for example, time when the abnormality detecting device 10 was connected to the battery 40 in the vehicle 1, and time when the ignition switch 50 was turned to be the On state during a state that the abnormality detecting device 10 is connected to the battery 40.

Even if a circuit failure in such a state that the state detecting unit 30 is constantly turned on is generated, the circuit failure can be discovered before the abnormality detecting unit 70A starts an abnormality detecting operation, so that a wrong detection due to the abnormality in functional parts such as the state detecting unit 30 and the abnormality detecting unit 11 can be prevented, or more specifically the abnormality of functional parts can be appropriately detected.

Furthermore, the abnormality detecting unit 70A is configured to store history information such as the circuit failures, the abnormality detection, and self diagnosis results into the memory cell 12.

The abnormality detecting unit 70A is connected to the battery 20 without interposing the ignition switch 50 therebetween. That is, the abnormality detecting unit 70A executes operations constantly as long as a state of running out of the battery is not generated, because power is constantly supplied from the battery 40. Therefore, the abnormality detecting unit 70A is composed of a microcomputer with low power consumption or the like.

The power supply control unit 11 is configured to switch a state of power supply to the state detecting unit 30 when the abnormality was detected by the abnormality detecting unit 70A, or more specifically when the state detecting unit 30 was changed from the Off state to the On state.

That is, the power supply control unit 11 controls power supply to the state detecting unit 30 to be reduced when the abnormality was detected by the abnormality detecting unit 70A, so that the battery consumption is avoided.

To be more specific, the power supply control unit 11 has a configuration including a pnp-type transistor Tr1 for switching on and off in accordance with a voltage state of the terminal A1, an npn-type transistor Tr2 for switching on and off in accordance with a voltage state of the terminal C1, resistance R1 for causing a small current to flow in the state detecting unit 30, resistance R2 for causing a large current to flow in the state detecting unit 30, resistance R3 for fixing the voltage of the terminal B1 to a Hi state or Lo state, a remaining resistance group RE1 for use in dropping and dividing a voltage, and a condenser CE1 used as a filter.

The resistance R1 and the resistance R2 are configured to satisfy a relationship of R1>>R2 in order to cause a small current to flow in the state detecting unit 30 when the pnp-type transistor Tr1 exhibits the On state, while the resistance R2 and the resistance R3 are configured to satisfy a relationship of R3>>R2 in order to maintain the Hi state of a voltage in the terminal B1 when both of the pnp-type transistor Tr1 and the npn-type transistor Tr2 exhibit the On state and the state detecting unit 30 exhibits the Off state. A configuration with the R1 as 10 kΩ, the R2 as 1 kΩ, and the R3 as 22 kΩ can be exemplified.

The power supply control unit 11 is also configured to operate at least when the ignition switch 50 is turned off. That is, the power supply control unit 11 is connected to the battery 40 without interposing the ignition switch 50 therebetween, and configured to operate in response to power supply from the battery 40 irrespective of a state of the ignition switch 50, along with the abnormality detecting unit 70A which is similarly connected to the battery 40 without interposing the ignition switch 50 therebetween.

Current supply to the state detecting unit 30 is provided by the battery 40, causing the battery 40 to be easily consumed when the ignition switch 50 is turned off. Therefore, the power supply control unit 11 operates when the ignition switch 50 is turned off, so that power consumption in the state detecting unit 30 is suppressed to avoid consumption of the battery 40.

The memory 12 is configured to store history information such as the circuit failures, the abnormality detection, and self diagnosis results.

To be more specific, the abnormality detection history is meant to be collision history detected by the state detecting unit 30, and the self diagnosis results is meant to be results of the self diagnosis executed by the self diagnosis unit 71. Information stored in the memory 11 is read by the abnormality detecting unit 70A which received a demand of the control unit 60A, and sent to the control unit 60A.

The display device 61 is configured to display information sent from the control unit 60A, more specifically configured to display information in a warning lamp mounted onto a vehicle, and may display information in a monitor of a navigation system for example other than the warning lamp in the configuration.

Figure 4:
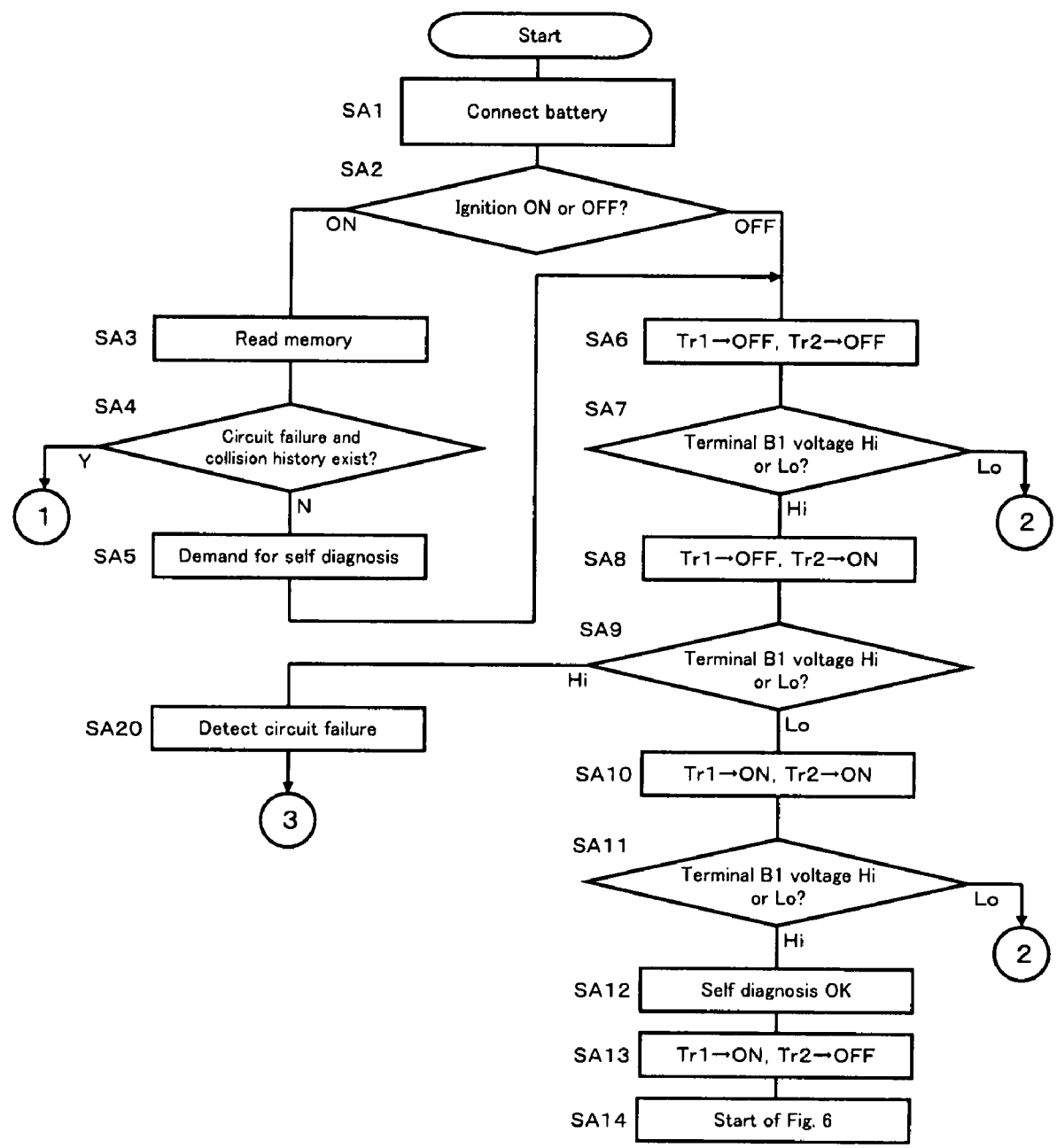
FIG. 4 is a flowchart to explain an operation of self diagnosis executed by the abnormality detecting device shown in FIG. 1.
Figure 5:
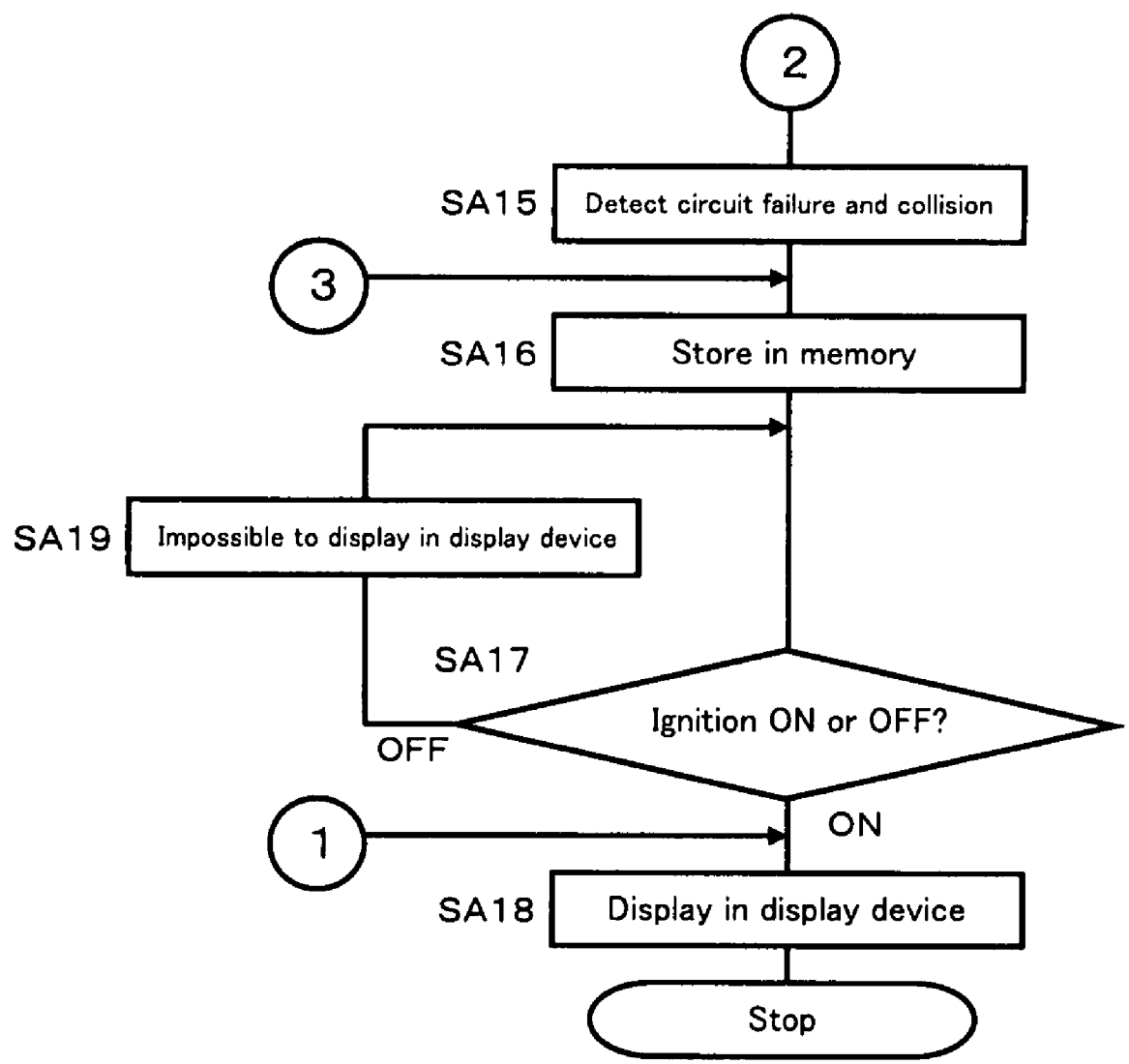
FIG. 5 is a flowchart to explain the operation of the self diagnosis executed by the abnormality detecting device shown in FIG. 1.

An operation to execute self diagnosis in the abnormality detecting device 10 will be explained below on the basis of flowcharts shown in FIGS. 4 and 5.

When the abnormality detecting device 10 is connected to the battery 40 (SA1), and if the ignition switch 50 is turned on (SA2), the control unit 60A demands to read contents stored in the memory cell 12 with respect to the abnormality detecting unit 70A, so that the abnormality detecting unit 70A which received the demand reads the contents stored in the memory cell 12 to transmit to the control unit 60A (SA3).

If history including the circuit failures and the abnormality detection exists in the contents stored in the memory 12 (SA4), information as stated above is displayed in the display device 61 (SA18). Meanwhile, if history including the circuit failures and abnormal detection does not exist in the contents stored in the memory 12 (SA4), the control unit 60A demands to execute the self diagnosis with respect to the abnormality detecting unit 70A (SA5).

If the ignition switch 50 is turned off in the step SA2, or if there is a demand from the control unit 60A to the abnormality detecting unit 70A to execute self diagnosis in the step SA5, the self diagnosis unit 71 incorporated in the abnormality detecting unit 70A executes diagnosis of whether or not the circuit failures and the abnormality detection exist by setting three kinds of voltage states in the terminal A1 and the terminal C1 in accordance with following procedures.

A first state is initially established by setting a voltage of the terminal A1 in the Hi state and a voltage of the terminal C1 in the Lo state in order to set both of the pnp-type transistor Tr1 and the npn-type transistor Tr2 in the Off state (SA6).

In the step SA6, if the voltage of the terminal B1 exhibits the Hi state (SA7), the self diagnosis unit 71 determines the first state as absence of the abnormality, followed by establishing a second state by setting both voltages of the terminal A1 and the terminal C1 in the Hi state in order to set the pnp-type transistor Tr1 in the Off state and the npn-type transistor Tr2 in the On state (SA8).

In the step SA8, if the voltage of the terminal B1 exhibits the Lo state (SA9), the self diagnosis unit 71 determines the second state as absence of the abnormality, followed by establishing a third state by setting the voltage of the terminal A1 in the Lo state and the voltage of the terminal C1 in the Hi state in order to set both of the pnp-type transistor Tr1 and the npn-type transistor Tr2 in the On state (SA10).

In the step SA10, if the voltage of the terminal B1 exhibits the Hi state (SA11), the self diagnosis unit 71 determines the third state as absence of abnormity, or more specifically entire states of the first through the third states are determined as absence of the abnormality, so that the state detecting unit 30 and the abnormality detecting unit 11 are determined to be normal as a result of the self diagnosis (SA12).

Thereafter, the abnormality detecting unit 70A sets both voltages of the terminal A1 and the terminal C1 in the Lo state for setting the pnp-type transistor Tr1 in the On state and the npn-type transistor Tr2 in the Off state (SA13) in order to start an abnormality detecting operation with respect to the state detecting unit 30 (SA14). Meanwhile, processing below will be executed in the case of having the abnormality in the diagnosis result.

If the voltage of the terminal B1 exhibits the Lo state in the step SA6 (SA7), or if the voltage of the terminal B1 exhibits the Lo state in the step SA10 (SA11), the self diagnosis unit 71 detects that abnormality such as the circuit failures and collisions was generated (SA15), and stores information on the detected abnormality in the memory 12 (SA16). Moreover, in the step SA8, if the voltage of the terminal B1 exhibits the Hi state (SA9), a generated circuit failure is detected (SA20), and information on the detected circuit failure is stored in the memory 12 (SA16).

Thereafter, if the ignition switch 50 is turned on (SA17), the control unit 60A causes the display device 61 to display information on the abnormality (SA18). If the ignition switch 50 is turned off (SA17), it is impossible to display the abnormality information in the display device 61 due to the control unit 60A which is not operating (SA19), so that the abnormality information is displayed when the ignition switch 50 is turned on.

An operation to execute the abnormality detection in the abnormality detecting device 10 will be explained below on the basis of a flowchart shown in FIG. 6.

In a normal state in which the self diagnosis by the self diagnosis unit 71 results in absence of the abnormality and abnormality is not detected in an installation state of the radar device 20 mounted onto the vehicle 1, or in a state that the state detecting unit 30 is turned off, the voltage of the terminal A1 and the voltage of the terminal C1 are both set to the Lo state by the abnormality detecting unit 70A. Therefore, the pnp-type transistor Tr1 exhibits the On state and the npn-type transistor Tr2 exhibits the Off state. As a result, the voltage of the terminal B1 is set to the Hi state (SB1).

In the step SB1, the abnormality detecting unit 70A refers to the voltage of the terminal B1, and if the voltage of the terminal B1 is shifted from the Hi state to the Lo state (SB2), the abnormality is detected (SB3), and information on the detected abnormality is stored in the memory 12 (SB4).

Between the operations from the step SB3 to the step SB4, the pnp-type transistor Tr1 and the npn-type transistor Tr2 are both turned to be the Off state. Moreover, because the state detecting unit 30 is grounded, the voltage of the terminal B1 is set to the Lo state (SB5).

The step SB5 will be described. If the abnormality is generated in an installation state of the radar device 20 caused by a collision or the like, the state detecting unit 30 is turned to be the On state, so that a current or a large current flowing via the pnp-type transistor Tr1 and the resistance R2 is caused to flow in the state detecting unit 30. Furthermore, since the state detecting unit 30 is grounded by turning into the On state, the terminal B1 is also grounded, so that the voltage of the terminal B1 is shifted from the Hi state to the Lo state. When the shift from the Hi state to the Lo state in the voltage of the terminal B1 is detected, the abnormality detecting unit 70 causes the voltage of the terminal A1 to shift from the Lo state to the Hi state, so that the pnp-type transistor Tr1 is shifted from the On state to the Off state. As a result, the pnp-type transistor Tr1 is turned to the be the Off state, so that a current or a small current flowing via the resistance R1 is caused to flow in the state detecting unit 30, and a current supplied to the state detecting unit 30 is suppressed.

Figure 6:
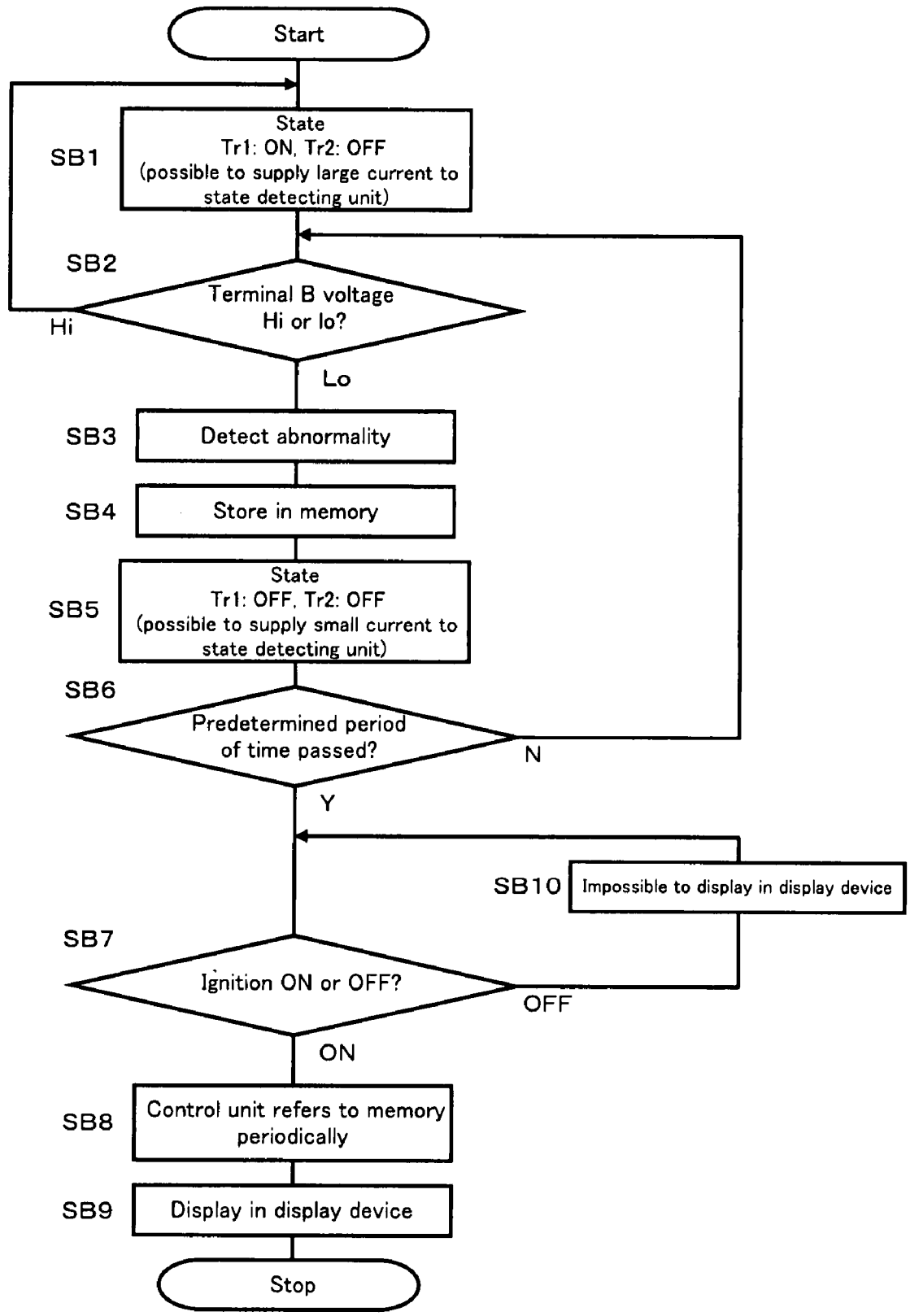
FIG. 6 is a flowchart to explain an operation of abnormality detection executed by the abnormality detecting device shown in FIG. 1.

Although it is not shown in FIG. 6, the voltage of the terminal B1 is shifted from the Lo state to the Hi state when the state detecting unit 30 is shifted from the On state to the Off state or from an abnormal state to a normal state. When the shift from the Lo state to the Hi state in the voltage of the terminal B1 is detected, the abnormality detecting unit 70 causes the voltage of the terminal A1 to shift from the Hi state to the Lo state, so that the pnp-type transistor Tr1 is shifted from the Off state to the On state. As a result, processing is returned to a state of the step SB1.

In a state of the step SB5, if a predetermined period of time has not passed yet (SB6), the abnormality detecting unit 70A refers to the voltage of the terminal B1 again, and if the Lo state is maintained in the voltage of the terminal B1 (SB2), the abnormality is detected again (SB3).

Meanwhile, in a state of the step SB5, if a predetermined period of time has passed (SB6), a state of the ignition switch 50 is referred. If the ignition switch 50 is turned on (SB7), the control unit 60A periodically refers to contents stored in the memory 12 (SB8), and causes the display device 61 to display abnormality information if information on the generated abnormality is stored (SB9).

Also, if the ignition switch 50 is turned off (SB7), it is impossible to display abnormality information in the display device 61 due to the control unit 60A which is not operating (SB10), so that the abnormality information is displayed in the display device 61 when the ignition switch 50 is turned on.

Another embodiment will be explained below. Explanation was made in the above embodiment for the configuration of performing an abnormality detecting operation in which the power supply control unit 11 reduces a current supplied to the state detecting unit 30 by the control of the abnormality detecting unit 70A when the state detecting unit 30 is turned to be the On state, and the self diagnosis operation of whether or not an operation is normally performed by switching states of the pnp-type transistor Tr1 and the npn-type transistor Tr2 every time to connect a battery and every time when the ignition switch 50 is turned to be the On state. However, the configuration may be achieved by performing the abnormality detecting operation in which the power supply control unit 11 cuts off a current to supply the state detecting unit 30 by the control of the abnormality detecting unit 70A when the state detecting unit 30 is turned to be the On state, and the self diagnosis operation of whether or not the operation is normally performed by switching a state of the pnp-type transistor every time to connect a battery and every time when the ignition switch 50 is turned to be the On state.

Figure 7:
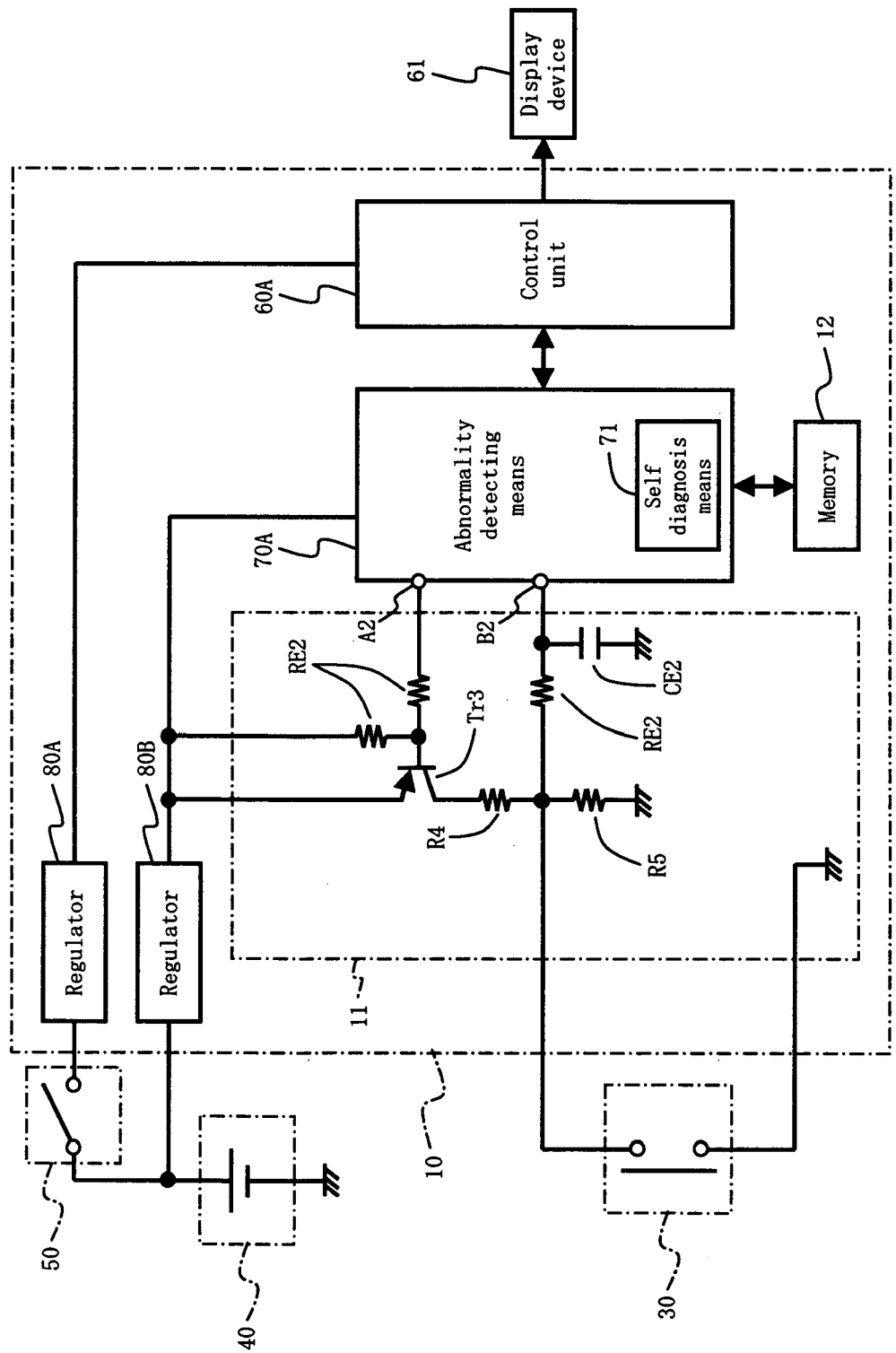
FIG. 7 is a function block configuration diagram showing another embodiment of the abnormality detecting device according to the present invention.

In the present embodiment, the power supply control unit 11 has a configuration as shown in FIG. 7 which is different from the embodiment in FIG. 1, and the power supply control unit 11 is configured to cut off power supply to the state detecting unit 30 when the abnormality was detected by the abnormality detecting unit 70A or more specifically when the state detecting unit 30 was changed form the Off state to the On state.

To be more specific, the power supply control unit 11 has a configuration including a pnp-type transistor Tr3 capable of switching on and off in accordance with a voltage state of the terminal A2, resistance R4 for causing a current to flow in the state detecting unit 30, resistance R5 for fixing a voltage of the terminal B2 in the abnormality detecting unit 70A to the Hi state and the Lo state, a remaining resistance group RE2 for use in dropping and dividing a voltage, and a condenser CE2 used as a filter.

In order to sustain the voltage of the terminal B2 in the Hi state when the state detecting unit 30 exhibits the Off state, the resistance R4 and the resistance R5 are configured to satisfy a relationship of R5>>R4. A configuration with the R4 as 1 kΩ and the R5 as 100 kΩ can be exemplified.

Moreover, an aspect in the configuration that the power supply control unit 11 operates at least when the ignition switch 50 is turned off is similar to that of the embodiment shown in FIG. 1.

Figure 8:
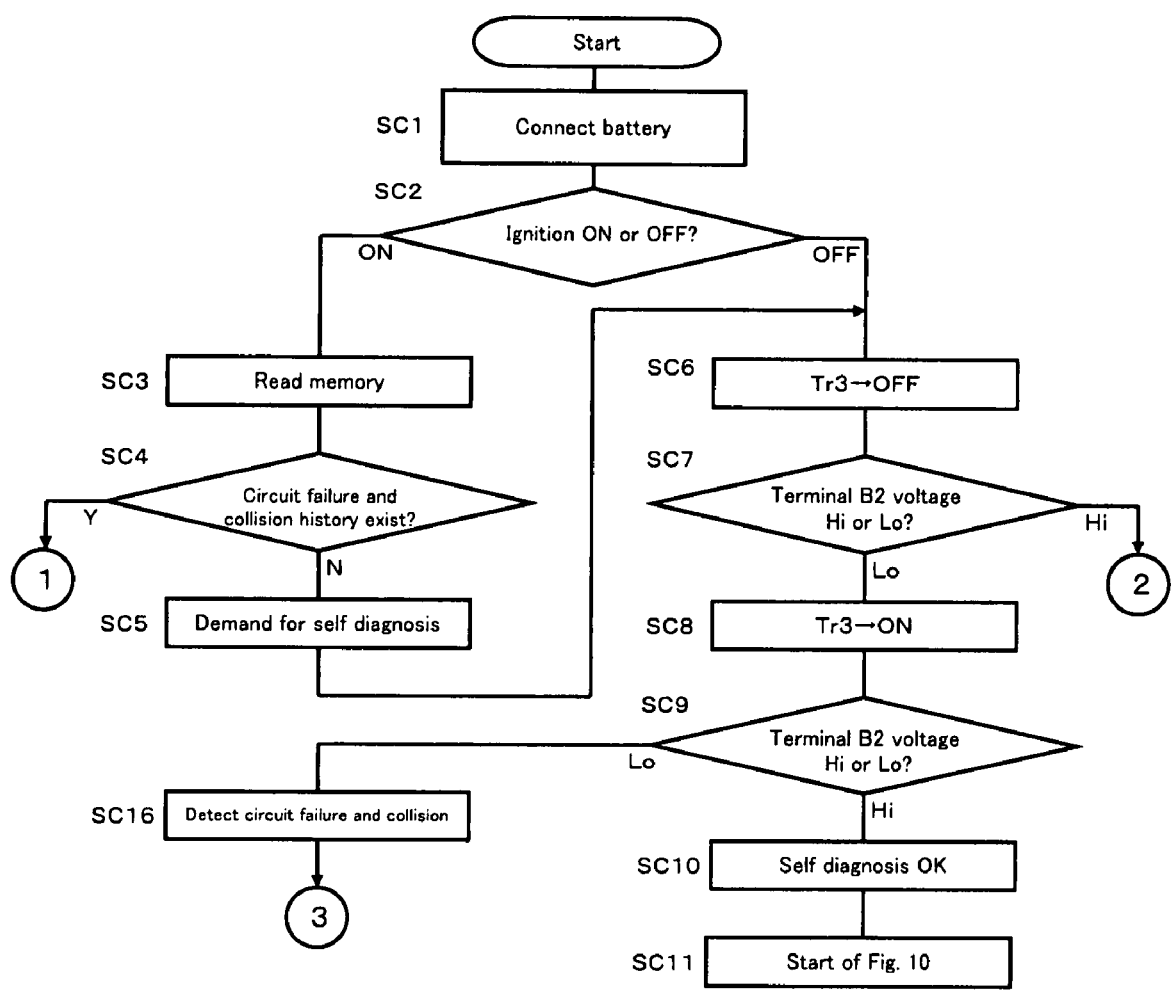
FIG. 8 is a flowchart to explain the operation of the self diagnosis executed by the abnormality detecting device shown in FIG. 7.
Figure 9:
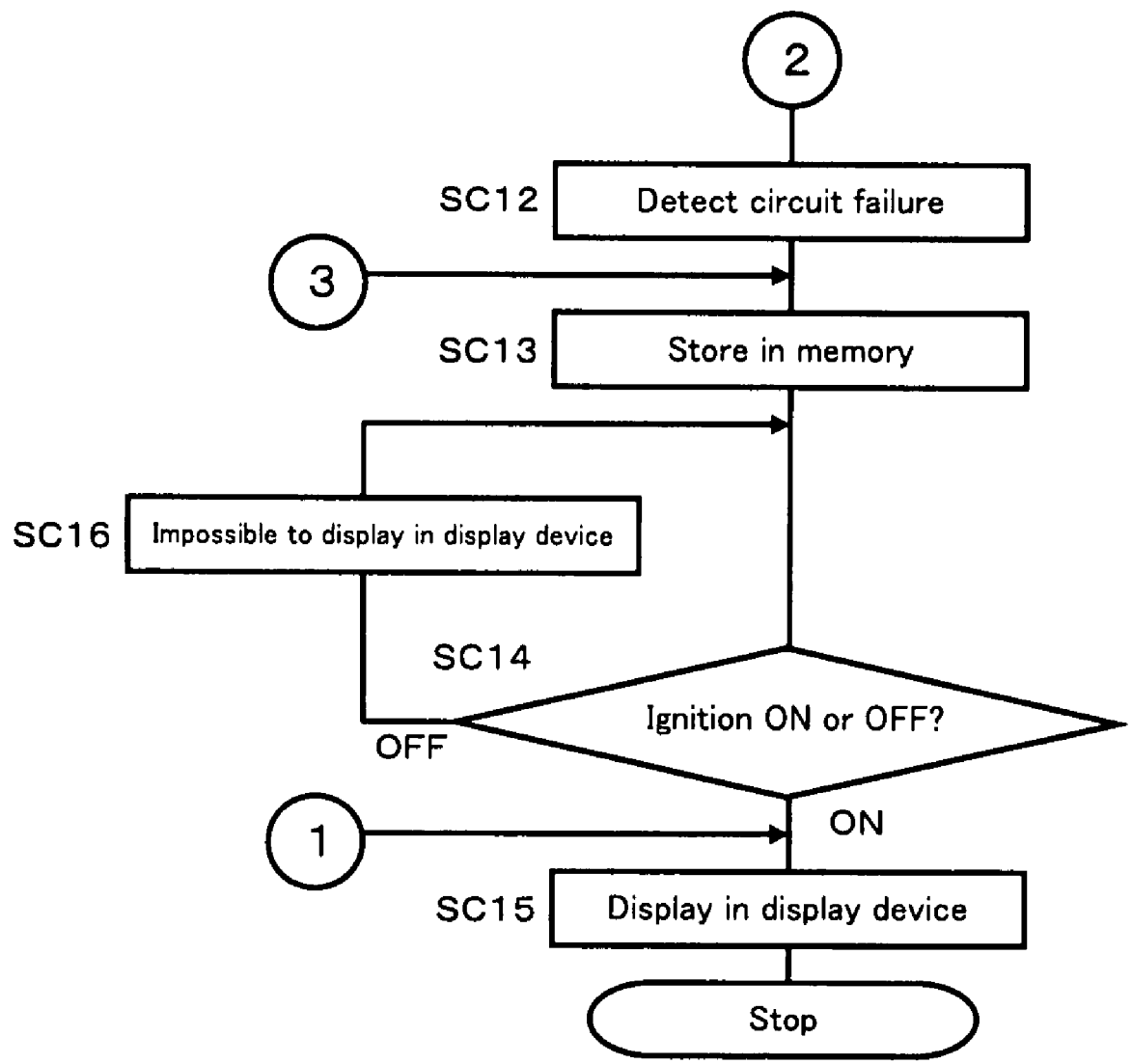
FIG. 9 is a flowchart to explain the operation of the self diagnosis executed by the abnormality detecting device shown in FIG. 7.

An operation to execute self diagnosis in the abnormality detecting device 10 according to the present embodiment will be explained below on the basis of flowcharts shown in FIG. 8 and FIG. 9.

When the abnormality detecting device 10 is connected to the battery 40 (SC1), and if the ignition switch is turned on (SC2), the control unit 60A demands to read contents stored in the memory 12 with respect to the abnormality detecting unit 70A, so that the abnormality detecting unit 70A which received the demand reads the contents stored in the memory 12 to transmit to the control unit 60A (SC3).

If history including the circuit failures and the abnormality detection exists in the contents stored in the memory 12 (SC4), information as stated above is displayed in the display device 61 (SC15). Meanwhile, if history including the circuit failures and the abnormality detection does not exist in the contents stored in the memory 12 (SC4), the control unit 60A demands to execute the self diagnosis with respect to the abnormality detecting unit 70A (SC5).

If the ignition switch 50 is turned off in the step SC2, or if there is a demand from the control unit 60A to the abnormality detecting unit 70A to execute self diagnosis in the step SC5, the self diagnosis unit 71 incorporated in the abnormality detecting unit 70A executes diagnosis of whether or not the circuit failures and the abnormality detection exist by setting two kinds of voltage states in the terminal A2 in accordance with following procedures. A first state is established by setting a voltage of the terminal A2 in the Hi state in order to set the pnp-type transistor Tr3 in the Off state (SC6).

In the step SC6, if the voltage of the terminal B2 exhibits the Lo state (SC7), the self diagnosis unit 71 determines the first state as absence of the abnormality, followed by establishing a second state by setting the voltage of the terminal A2 in the Lo state in order to set the pnp-type transistor Tr3 in the On state (SC8).

In the step SC8, if the voltage of the terminal B2 exhibits the Hi state (SC9), the self diagnosis unit 71 determines the second step as absence of the abnormality, which means that the first state and the second state are both determined as absence of the abnormality, so that the state detecting unit 30 and the abnormality detecting unit 11 are determined to be normal as a result of the self diagnosis (SC10). Thereafter, the abnormality detecting unit 70A starts the abnormality detecting operation (SC11).

Meanwhile, processing below will be executed in the case of having the abnormality in the diagnosis result.

In the step SC6, if the voltage of the terminal B2 exhibits the Hi state (SC7), the self diagnosis unit 71 detects that the circuit failure was generated (SC12), so that information on the detected circuit failure is stored in the memory 12 (SC13). Also, in the step SC8, if the voltage of the terminal B2 exhibits the Lo state (SC9), generated abnormality such as the circuit failures and collisions is detected (SC16), so that information on the detected abnormality is stored in the memory 12 (SC13).

Thereafter, if the ignition switch 50 is turned on (SC14), the control unit 60A causes the display device 61 to display information on the abnormality (SC15). If the ignition switch 50 is turned off (SC14), it is impossible to display information on the abnormality in the display device 61 due to the control unit 60A which is not operating (SC16), so that the abnormality information is displayed in the display device 61 when the ignition switch 50 is turned on.

Figure 10:
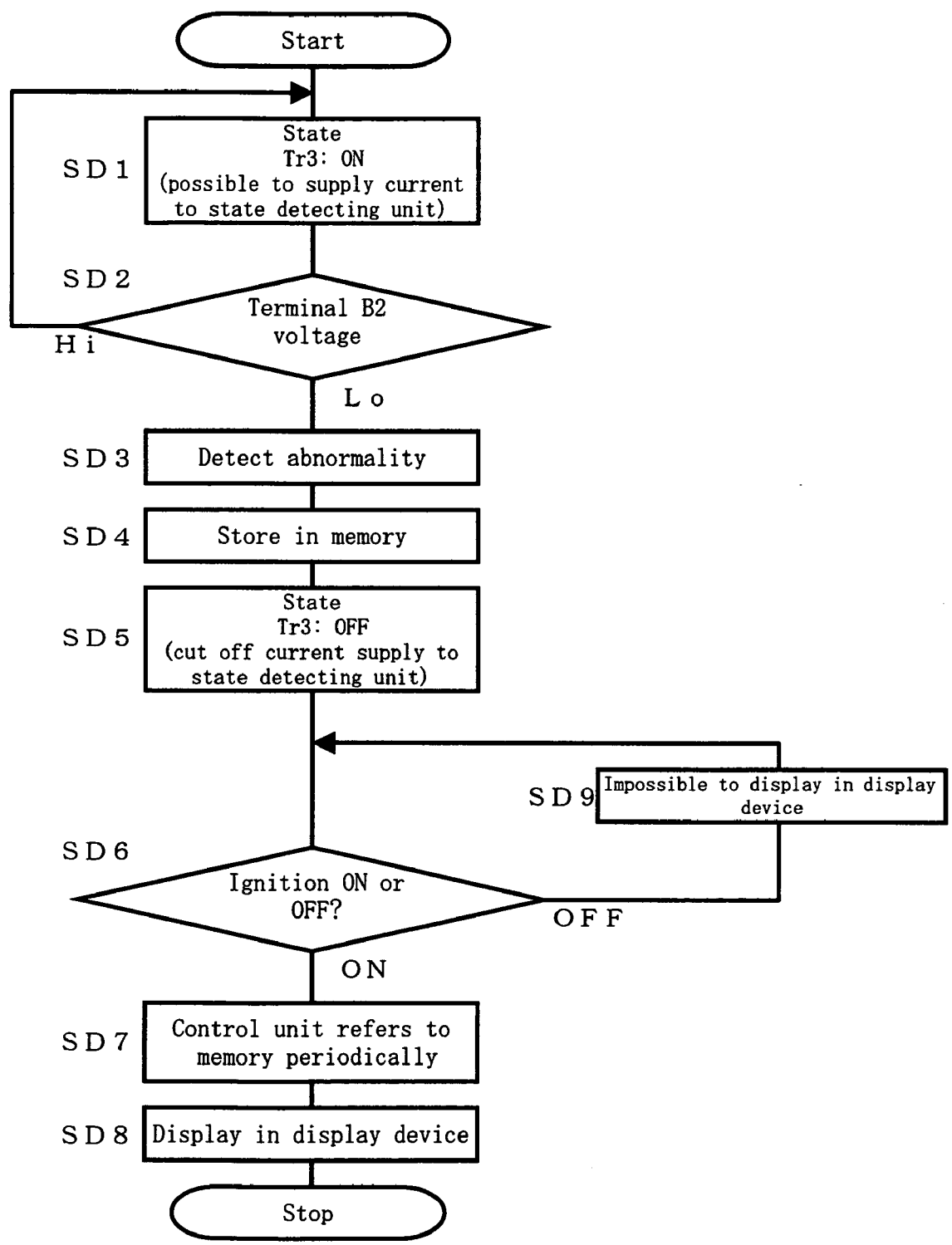
FIG. 10 is a flowchart to explain an operation of abnormality detection executed by the abnormality detecting device shown in FIG. 7.

An operation to execute the abnormality detection in the abnormality detecting device 10 according to the present embodiment will be explained below on the basis of a flowchart shown in FIG. 10.

In a normal state in which the self diagnosis results in absence of the abnormality and the abnormality is not detected in an installation state of the radar device 20 mounted onto the vehicle 1, or in the Off state of the state detecting unit 30, the voltage of the terminal A2 is set to the Lo state by the abnormality detecting unit 70A. Therefore, the pnp-type transistor Tr3 is turned to be the On state. As a result, the voltage of the terminal B2 is set to the Hi state (SD1).

In the step SD1, the abnormality detecting unit 70A refers to the voltage of the terminal B2, and if the voltage of the terminal B2 is shifted from the Hi state to the Lo state (SD2), the abnormality is detected (SD3), so that information on the detected the abnormality is stored in the memory 12 (SD4).

Between the operations from the step SD3 to the step SD4, the pnp-type transistor Tr3 is turned to be the Off state. Also, since the state detecting unit 30 is grounded, the voltage of the terminal B2 is set to the Lo state (SD5).

The step SD5 will be described. If the abnormality is generated in an installation state of the radar device 20 caused by the collision or the like, the state detecting unit 30 is turned to be the On state, so that a current flowing via the pnp-type transistor Tr3 and the resistance R4 is caused to flow in the state detecting unit 30. Moreover, since the state detecting unit 30 is grounded by turning into the On state, the terminal B2 is also grounded, so that the voltage of the terminal B2 is shifted from the Hi state to the Lo state. When the shift from the Hi state to the Lo state in the voltage of the terminal B2 is detected, the abnormality detecting unit 70 causes the voltage of the terminal A2 to shift from the Lo state to the Hi state, so that the pnp-type transistor Tr3 is shifted from the On state to the Off state. As a result, the pnp-type transistor Tr3 is turned to be the Off state, so that a current to the state detecting unit 30 is cut off.

Thereafter, with reference to a state of the ignition switch 50, if the ignition switch 50 is turned on (SD6), the control unit 60A periodically refers to contents stored in the memory 12 (SD7), and causes the display device 61 to display the abnormality information in the case of storing information on the generated abnormality (SD8).

Meanwhile, if the ignition switch 50 is turned off (SD6), it is impossible to display the abnormality information in the display device 61 due to the control unit 60A which is not operating (SD9), so that display is executed when the ignition switch 50 is turned on.

In the embodiment shown in FIG. 7, even if an abnormality state is eliminated and the state detecting unit 30 is shifted from the On state to the Off state, the Off state is sustained in the pnp-type transistor Tr3, so that the voltage of the terminal B2 does not shift to the Hi state. That is, once the state detecting unit 30 is turned to be the On state, it is impossible in the configuration to return to an initial state of the abnormality detecting unit 70A, but it may be allowed in the configuration to return to the initial state.

For example, if the state detecting unit 30 exhibits the On state or an abnormal state, the abnormality detecting unit 70A controls that the voltage of the terminal A2 is turned to be the Lo state periodically, so that the pnp-type transistor Tr3 is shifted to the On state periodically. If the state detecting unit 30 is returned to the Off state or a normal state at the time of periodical shifting to the On state in the pnp-type transistor Tr3, the voltage of the terminal B2 in the abnormality detecting unit 70A is shifted to the Hi state, so that it is allowed to return to the initial state.

In the above described embodiment, explanation was made for the case of applying the present invention to the radar device 20 which detects obstacles or the like by sending radar waves for forward monitoring of the vehicle. The radar device is arranged in a position easily influenced by a contact with other vehicles and obstacles in many cases for a purpose of detecting external circumstances of a vehicle, so that it is a preferable application example of the present invention.

Although explanation was made for the configuration of arranging the radar device 20 adjacent to a front grill of an engine room in the vehicle 1, the present invention can also be applied to the case in which the radar device 20 is arranged in a position other than the vicinity of the front of the vehicle 1. Moreover, the present invention is applicable to devices other than the radar device 20.

The devices can be exemplified by a vehicle-mounted camera arranged in a rear portion of a vehicle for use in observation of circumstances at a rear side from a driver seat in parking or the like, a vehicle-mounted camera arranged within a side mirror for detecting obstacles in a side surface or the like, and a vibration sensor used for security installed in the inside of a vehicle or the like. The present invention can be applied as a device for detecting the abnormality of any equipment arranged in a position easily influenced from the outside.

The above described embodiments are merely an example of the present invention, and a concrete configuration or the like in each of the blocks can be appropriately modified to design within a scope of exhibiting functional effects according to the present invention as needles to say.

What is claimed is:

1. A vehicle abnormality detecting device comprising:
    an abnormality detecting unit for detecting abnormality on the basis of a state of current flow to a state detecting unit, the state of current flow including a normal current, an abnormal current and an adjusted current; and a power supply control unit for switching a state of a power supply to the state detecting unit when the abnormality is detected by the abnormality detecting unit, wherein:

the abnormality detecting unit detects abnormality in an installation state of a device in a vehicle on the basis of the state of current flow to the state detecting unit in which the abnormal current is supplied when the installation state of the device in the vehicle chances from a normal state to an abnormal state; and the power supply control unit switches, after the abnormality is detected, a state of the power supply for the state detecting unit to a state (1) supplying the adjusted current smaller than the abnormal current or (2) controlling the adjusted current to be cut off, so that consumption of power is suppressed.

2. The vehicle abnormality detecting device according to claim 1, wherein:

the state detecting unit is composed of a switch mechanism of a mechanical contact type, and the power supply control unit switches the state of the power supply after a state change on the basis of an On state and an Off state of the switch mechanism.

3. The vehicle abnormality detecting device according to claim 1, wherein:

the power supply control unit operates at least when an ignition switch is turned off.

4. The vehicle abnormality detecting device according to claim 3, wherein:

the state detecting unit is composed of a switch mechanism of a mechanical contact type, and the power supply control unit switches the state of the power supply after a state change on the basis of an On state and an Off state of the switch mechanism.

5. The vehicle abnormality detecting device according to claim 1, wherein:

the installation state of the device is an installation position of the device.

6. The vehicle abnormality detecting device according to claim 1, wherein:

the state detecting unit is composed of a switch mechanism of a mechanical contact type, the switch mechanism being connected in series to a resistor, the switch mechanism and the resistor being disposed between a positive electrode and a negative electrode of a battery.

7. The vehicle abnormality detecting device according to claim 1, wherein:

the state of current flow in the normal state is the normal current, and the abnormal current is greater than the normal current.

8. The vehicle abnormality detecting device according to claim 1, wherein:

the power supply control unit switches, after the abnormality is detected, the state of the power supply for the state detecting unit to the state supplying the adjusted current smaller than the abnormal current.

9. The vehicle abnormality detecting device according to claim 1, wherein:

the power supply control unit switches, after the abnormality is detected, the state of the power supply for the state detecting unit to the state controlling the adjusted current to be cut off.

10. A vehicle abnormality detecting device comprising:

an abnormality detecting unit for detecting abnormality on the basis of a state of current flow to a state detecting unit; and a power supply control unit for switching a state of a power supply to the state detecting unit when the abnormality is detected by the abnormality detecting unit, wherein:

the abnormality detecting unit comprises a self diagnosis unit for detecting whether or not the state detecting unit or the power supply control unit normally operates, and executes self diagnosis at least at the time of starting the power supply.

11. The vehicle abnormality detecting device according to claim 10 wherein:

the state detecting unit is composed of a switch mechanism of a mechanical contact type, and the power supply control unit switches the state of the power supply after a state change on the basis of an On state and an Off state of the switch mechanism.

12. The vehicle abnormality detecting device according to claim 10, wherein:

the power supply control unit operates at least when an ignition switch is turned off.

13. The vehicle abnormality detecting device according to claim 10, wherein:

the power supply control unit operates at least when an ignition switch is turned off, the state detecting unit is composed of a switch mechanism of a mechanical contact type, and the power supply control unit switches the state of the power supply after a state change on the basis of an On state and an Off state of the switch mechanism.

14. A vehicle abnormality detecting device comprising:

an abnormality detecting unit for detecting abnormality on a basis of a state of current flow to a state detecting unit; and a power supply control unit for switching a state of a power supply to the state detecting unit when the abnormality is detected by the abnormality detecting unit, wherein:

the state detecting unit detects an installation position of a radar device for detecting external circumstances of the vehicle.

15. The vehicle abnormality detecting device according to claim 14, wherein: the state detecting unit is composed of a switch mechanism of a mechanical contact type, and the power supply control unit switches the state of the power supply after a state change on the basis of an On state and an Off state of the switch mechanism.

* * * * *